(12) United States Patent
Diaham et al.

(10) Patent No.: US 12,464,739 B2
(45) Date of Patent: *Nov. 4, 2025

(54) MICRO-SCALE PASSIVE DEVICE WITH PARTICLES IN INSULATOR LAYER

(71) Applicant: Analog Devices International Unlimited Company, Limerick (IE)

(72) Inventors: Sombel Diaham, Villeneuve les Bouloc (FR); Baoxing Chen, Westford, MA (US)

(73) Assignee: Analog Devices International Unlimited Company, Limerick (IE)

( * ) Notice: Subject to any disclaimer, the term of this patent is extended or adjusted under 35 U.S.C. 154(b) by 275 days.

This patent is subject to a terminal disclaimer.

(21) Appl. No.: 17/856,785

(22) Filed: Jul. 1, 2022

(65) Prior Publication Data

US 2024/0006469 A1    Jan. 4, 2024

(51) Int. Cl.
*H10D 1/20*    (2025.01)
*H01L 23/522*   (2006.01)
(Continued)

(52) U.S. Cl.
CPC ......... *H10D 1/692* (2025.01); *H01L 23/5223* (2013.01); *H01L 23/5227* (2013.01); *H10D 1/20* (2025.01)

(58) Field of Classification Search
CPC .............. H01L 23/5223; H01L 23/5227; H01L 23/5329; H01L 23/53295; H01L 28/60; H01L 28/10; H10D 1/692; H10D 1/20
See application file for complete search history.

(56) References Cited

U.S. PATENT DOCUMENTS 3,549,825 A    12/1970    Trimble et al.
4,914,561 A    4/1990    Rice et al.
(Continued)

FOREIGN PATENT DOCUMENTS

CN    101228678 A    7/2008
CN    101568976 A    10/2009
(Continued)

OTHER PUBLICATIONS

Cheung et al., Shielded Passive Devices for Silicon-Based Monolithic Microwave and Millimeter-Wave Integrated Circuits. IEEE Journal of Solid-State Circuits. May 2006; 41(5):1183-1200.
(Continued)

*Primary Examiner* — Omar F Mojaddedi
(74) *Attorney, Agent, or Firm* — Schwegman Lundberg & Woessner, P.A.

(57) ABSTRACT

Micro-scale passive devices, such as transformers and capacitors, having an insulator layer with insulative particles and/or conductive or nonlinear conductive particles disposed therein. The insulative particles disposed in the insulator layer can increase a breakdown electric field of the device, and the conductive or nonlinear conductive particles disposed in the insulator layer can reduce a maximum electric field of the device. Increasing the breakdown electric field of the device and/or reducing the maximum electric field of the device can increase the lifespan of a micro-scale passive device, and/or may allow the device to operate at a higher threshold electric field without breakdown of the device.

16 Claims, 12 Drawing Sheets

(51) Int. Cl.
*H01L 23/532* (2006.01)
*H10D 1/00* (2025.01)
*H10D 1/68* (2025.01)

(56) References Cited

U.S. PATENT DOCUMENTS

| | | | |
|---|---|---|---|
| 5,598,327 | A | 1/1997 | Someville et al. |
| 5,781,077 | A | 7/1998 | Leitch et al. |
| 5,959,522 | A | 9/1999 | Andrews |
| 6,291,907 | B1 | 9/2001 | Haigh et al. |
| 6,420,952 | B1 | 7/2002 | Redilla |
| 6,882,263 | B2 | 4/2005 | Yang et al. |
| 7,042,325 | B2 | 5/2006 | Giandalia et al. |
| 7,474,190 | B2 | 1/2009 | Strzalkowski et al. |
| 7,622,887 | B2 | 11/2009 | Yoshimura |
| 7,646,305 | B2 | 1/2010 | Cote et al. |
| 7,994,890 | B2 | 8/2011 | Edo et al. |
| 8,238,074 | B2 | 8/2012 | Steeneken |
| 8,269,594 | B2 | 9/2012 | Yoshimura et al. |
| 8,288,894 | B2 | 10/2012 | Yoshimura |
| 9,236,171 | B2 | 1/2016 | Ito et al. |
| 9,391,016 | B2 | 7/2016 | Shen et al. |
| 9,793,203 | B2 | 10/2017 | Tao et al. |
| 9,929,038 | B2 | 3/2018 | O'Sullivan |
| 10,074,713 | B1 | 9/2018 | Briano |
| 11,728,090 | B2 | 8/2023 | McGuinness et al. |
| 2005/0128038 | A1 | 6/2005 | Hyvonen |
| 2006/0028313 | A1 | 2/2006 | Strzalkowski et al. |
| 2006/0065948 | A1 | 3/2006 | Yeh et al. |
| 2007/0001258 | A1* | 1/2007 | Aihara ............... H01G 4/008 257/528 |
| 2007/0298520 | A1 | 12/2007 | Renaud et al. |
| 2009/0278211 | A1* | 11/2009 | Kim ................... H10D 1/68 204/192.1 |
| 2010/0060381 | A1* | 3/2010 | Das .................... H05K 1/0234 333/172 |
| 2010/0157505 | A1 | 6/2010 | Feichtinger et al. |
| 2010/0328012 | A1 | 12/2010 | De Rooij et al. |
| 2011/0006393 | A1* | 1/2011 | Cui .................... H01G 4/206 257/532 |
| 2011/0147891 | A1* | 6/2011 | Furukawa ........... H01G 4/1227 257/E29.345 |
| 2011/0241160 | A1 | 10/2011 | Kerber et al. |
| 2014/0252533 | A1 | 9/2014 | O'Sullivan |
| 2015/0380477 | A1* | 12/2015 | Huang ............. H01L 21/02112 257/532 |
| 2016/0152794 | A1 | 6/2016 | Diaham et al. |
| 2018/0130867 | A1 | 5/2018 | Lambkin et al. |
| 2019/0139883 | A1* | 5/2019 | Gandhi ............... H01L 23/5222 |
| 2019/0206981 | A1 | 7/2019 | Bonifield et al. |
| 2020/0343037 | A1 | 10/2020 | Chen et al. |
| 2021/0249185 | A1 | 8/2021 | McGuinness et al. |
| 2023/0162904 | A1 | 5/2023 | Chen et al. |
| 2024/0006470 | A1 | 1/2024 | Diaham et al. |

FOREIGN PATENT DOCUMENTS

| | | |
|---|---|---|
| CN | 102255143 A | 11/2011 |
| CN | 204792387 U | 11/2015 |
| CN | 105655113 A | 6/2016 |
| CN | 106024340 A | 10/2016 |
| CN | 106470019 A | 3/2017 |
| CN | 109155535 A | 1/2019 |
| DE | 10 2004 036139 A1 | 3/2006 |
| DE | 10 2011 006 454 A1 | 10/2011 |
| EP | 1 420 420 A2 | 5/2004 |
| EP | 1 855 297 A1 | 11/2007 |
| EP | 3 020 050 A1 | 5/2016 |
| FR | 3 008 223 A1 | 1/2015 |
| JP | 2016-531972 A | 10/2016 |
| WO | 98/50956 A1 | 11/1998 |
| WO | 2015/004115 A1 | 1/2015 |

OTHER PUBLICATIONS

Islam, Advanced Interfacing Techniques for the Capacitive Sensors. Advanced Interfacing Techniques for Sensors. Smart Sensors, Measurement and Instrumentation. Apr. 2017; 25: 73-109.

* cited by examiner

MICRO-SCALE PASSIVE DEVICE WITH PARTICLES IN INSULATOR LAYER

FIELD OF THE DISCLOSURE

The present application relates to micro-scale passive devices, such as transformers or capacitors.

BACKGROUND

Micro-scale passive devices, such as transformers or capacitors, may provide an electric field between components. Electric fields may cause undesirable effects on electrical components.

SUMMARY OF THE DISCLOSURE

Micro-scale passive devices, such as transformers and capacitors, having an insulator layer with insulative particles and/or conductive or nonlinear conductive particles disposed therein. The insulative particles disposed in the insulator layer can increase a breakdown electric field of the device, and the conductive or nonlinear conductive particles disposed in the insulator layer can reduce a maximum electric field of the device. Increasing the breakdown electric field of the device and/or reducing the maximum electric field of the device can increase the lifespan of a micro-scale passive device, and/or may allow the device to operate at a higher threshold electric field without breakdown of the device.

According to various aspects of the present disclosure, there is provided an isolated micro-scale passive device comprising a first conductor and a second conductor formed on a substrate, an insulator layer disposed at least partially between the first conductor and the second conductor, and a plurality of insulative particles embedded in at least a portion of the insulator layer.

In some embodiments, at least a subset of the plurality of insulative particles are disposed between the first conductor and the second conductor.

In some embodiments, the second conductor is disposed between at least a subset of the plurality of insulative particles and the first conductor.

In some embodiments, the isolated micro-scale passive device further comprises a plurality of conductive or nonlinear conductive particles embedded in the insulator layer, wherein a first portion of the insulator layer has a first conductivity and the plurality of conductive or nonlinear conductive particles define a second portion of the insulator layer with a second conductivity greater than the first conductivity.

In some embodiments, at least a subset of the plurality of insulative particles form an isolation layer between the first conductor and the second conductor and at least a subset of the plurality of conductive or nonlinear conductive particles form a barrier layer around the second conductor.

In some embodiments, the insulative particles comprise at least one of $SiO_2$, $Al_2O_3$, or $SiN_x$.

In some embodiments, the insulative particles have a size between 1 nm and 20 nm.

In some embodiments, the insulative particles have a permittivity between 3.5 and 10 and and/or have a conductivity between $1\times10^{-18}$ S/cm and $1\times10^{-10}$ S/cm.

In some embodiments, the insulative particles have a density in the at least the portion of the insulator layer between 2 and 6 $g/cm^3$.

In some embodiments, the first conductor is patterned as a first coil and the second conductor is patterned as a second coil.

In some embodiments, the first conductor is disposed in a first plane and the second conductor is disposed in a second plane parallel to the first plane, the second plane different than the first plane.

In some embodiments, at least a portion of the first conductor is disposed in a first plane and at least a portion of the second conductor is disposed in the first plane.

According to various aspects of the present disclosure, there is provided an isolated micro-scale passive device comprising a first conductor and a second conductor formed on a substrate and means for increasing, between the first conductor and the second conductor, a threshold electric field for operating without breakdown of the isolated micro-scale passive device.

In some embodiments, the means for increasing the threshold electric field for operating without breakdown is configured to increase a breakdown electric field of the isolated micro-scale passive device.

In some embodiments, the means for increasing the threshold electric field for operating without breakdown comprises a plurality of insulative particles embedded in an insulator layer disposed at least partially between the first conductor and the second conductor.

In some embodiments, the means for increasing the threshold electric field for operating without breakdown further comprises a plurality of conductive or nonlinear conductive particles embedded in an insulator layer, wherein a first portion of the insulator layer has a first conductivity and the plurality of conductive or nonlinear conductive particles define a second portion of the insulator layer with a second conductivity greater than the first conductivity.

According to various aspects of the present disclosure, there is provided a method of manufacturing an isolated micro-scale passive device, the method comprising forming a first conductor on a substrate, forming an insulator layer on the substrate with a plurality of insulative particles embedded therein, and forming a second conductor on the substrate so that the insulator layer is disposed at least partially between the first conductor and the second conductor.

In some embodiments, forming the insulator layer comprises curing a liquid material.

In some embodiments, the method further comprises introducing the plurality of insulative particles into the liquid material prior to curing the liquid material.

In some embodiments, the method further comprises dispersing the plurality of insulative particles within the liquid material after introducing the plurality of insulative particles into the liquid material.

According to various aspects of the present disclosure, there is provided an isolated micro-scale passive device comprising a first conductor and a second conductor formed on a substrate, an insulator layer disposed at least partially between the first conductor and the second conductor, and a plurality of conductive or nonlinear conductive particles embedded in at least a portion of the insulator layer, wherein a first portion of the insulator layer has a first conductivity and the plurality of conductive or nonlinear conductive particles define a second portion of the insulator layer with a second conductivity greater than the first conductivity.

In some embodiments, at least a subset of the plurality of conductive or nonlinear conductive particles are disposed between the first conductor and the second conductor.

In some embodiments, the second conductor is disposed between at least a subset of the plurality of conductive or nonlinear conductive particles and the first conductor.

In some embodiments, the isolated micro-scale passive device further comprises a plurality of insulative particles embedded in the insulator layer.

In some embodiments, at least a subset of the plurality of insulative particles form an isolation layer between the first conductor and the second conductor and at least a subset of the plurality of conductive or nonlinear conductive particles form a barrier layer around the second conductor.

In some embodiments, the conductive or nonlinear conductive particles comprise at least one of SiC, ZnO, $Ag_2C_2$, graphene, carbon nanotubes, or a negative temperature coefficient (NTC) material.

In some embodiments, the conductive or nonlinear conductive particles have a size between 1 nm and 1 um.

In some embodiments, the conductive or nonlinear conductive particles have a conductivity between $1\times10^{-8}$ S/m and 100 MS/m.

In some embodiments, the conductive or nonlinear conductive particles have a particle-to-particle distance in the insulator layer such that conductivity of the at least the insulator layer having the plurality of conductive or nonlinear conductive particles embedded therein is below a percolation threshold.

In some embodiments, the first conductor is patterned as a first coil and the second conductor is patterned as a second coil.

In some embodiments, the first conductor is disposed in a first plane and the second conductor is disposed in a second plane parallel to the first plane, the second plane different than the first plane.

In some embodiments, at least a portion of the first conductor is disposed in a first plane and at least a portion of the second conductor is disposed in the first plane.

According to various aspects of the present disclosure, there is provided an isolated micro-scale passive device comprising a first conductor and a second conductor formed on a substrate and means for increasing, between the first conductor and the second conductor, a threshold electric field for operating without breakdown of the isolated micro-scale passive device.

In some embodiments, the means for increasing the threshold electric field for operating without breakdown is configured to reduce a maximum electric field of the isolated micro-scale passive device.

In some embodiments, the means for increasing the threshold electric field for operating without breakdown comprises a plurality of conductive or nonlinear conductive particles embedded in an insulator layer disposed at least partially between the first conductor and the second conductor, wherein a first portion of the insulator layer has a first conductivity and the plurality of conductive or nonlinear conductive particles define a second portion of the insulator layer with a second conductivity greater than the first conductivity.

In some embodiments, the means for increasing the threshold electric field for operating without breakdown further comprises a plurality of insulative particles embedded in the insulator layer.

According to various aspects of the present disclosure, there is provided a method of manufacturing an isolated micro-scale passive device, the method comprising forming a first conductor on a substrate, forming an insulator layer on the substrate, comprising forming a first portion of an insulator layer having a first conductivity forming a second portion of the insulator layer with a plurality of conductive or nonlinear conductive particles embedded therein, the particles defining the second portion of the insulator layer with a second conductivity greater than the first conductivity, and forming a second conductor on the substrate so that the insulator layer is disposed at least partially between the first conductor and the second conductor.

In some embodiments, forming the insulator layer comprises curing a liquid material.

In some embodiments, the method further comprises introducing the plurality of conductive or nonlinear conductive particles into the liquid material prior to curing the liquid material.

In some embodiments, the method further comprises dispersing the plurality of conductive or nonlinear conductive particles within the liquid material after introducing the plurality of insulative particles into the liquid material.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

I. Overview

Figure 1:
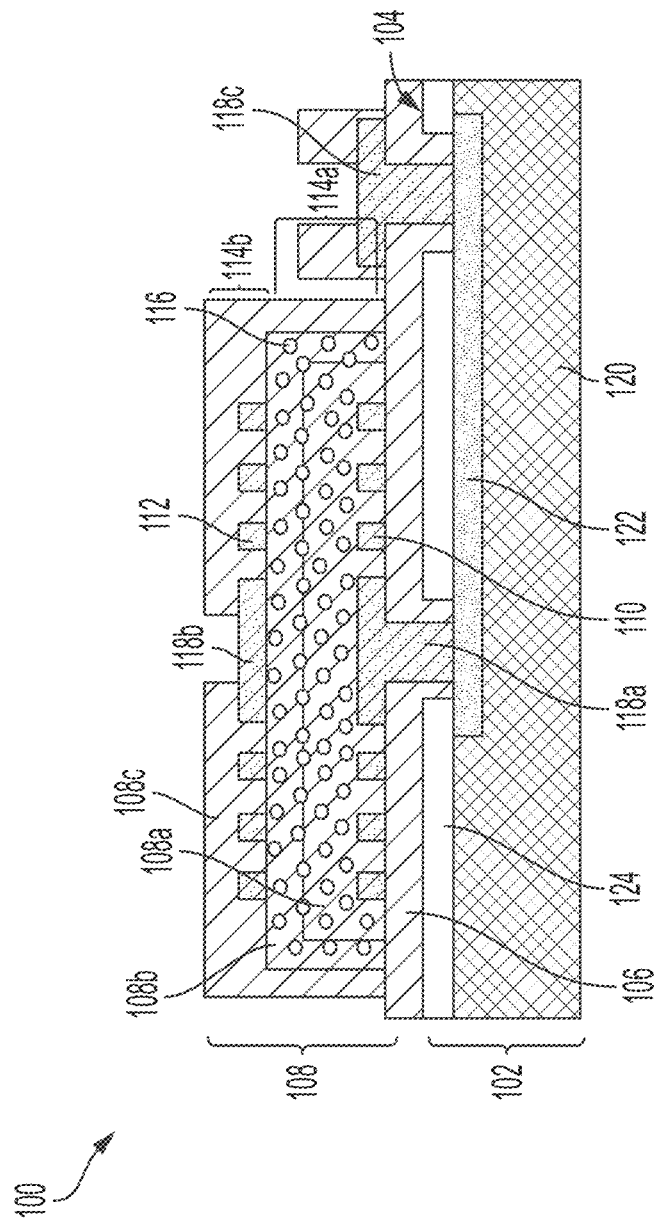
FIG. 1 is a cross-sectional side view of a micro-scale passive device, in accordance with some embodiments.

According to aspects of the present application, a micro-scale passive device is provided. The micro-scale device passive may comprise an isolated micro-scale passive device and may include a first conductor and a second conductor with an insulator layer at least partially between the first conductor and the second conductor. Such a micro-scale passive device is configured to exhibit an increased breakdown electric field and/or a reduced maximum electric field, which may allow the micro-scale passive device to operate for a longer lifespan and/or at a higher threshold electric field. The micro-scale passive device may have a plurality of insulative particles disposed within the insulator layer, and the particles may be configured to increase the breakdown electric field. Additionally, or alternatively, the micro-scale passive device may have a plurality of conductive particles disposed within the insulator layer, and the particles may be configured to reduce the maximum electric field.

The present disclosure relates to micro-scale passive devices. Two examples of micro-scale passive devices are transformers and capacitors. Transformers may be used to transform a first voltage level at a first portion of an electrical circuit to a second voltage level at a second portion of an electrical circuit. Transformers and capacitors may transfer data and/or power signals. Transformers and capacitors may be used to isolate signals between two portions of a circuit, and thus may form part of an isolator or an isolated device. Isolated devices may typically transfer alternating current (AC) signals but may also transfer direct current (DC) signals.

Micro-scale passive devices such as transformers and capacitors may include two or more micro-scale conductors. Each of a first conductor and a second conductor may be planar conductors, arranged on a substrate in a substantially planar configuration. A planar conductor of a transformer may comprise a planar coil. A planar coil may be patterned on a substrate in a substantially spiral shape about a conductor axis. In some embodiments, a micro-scale passive device may have a vertical isolation arrangement, and the device's planar coils may each be arranged in a single layer. In other embodiments, a micro-scale passive device may have a lateral isolation arrangement, and the device's planar coils may each be arranged in multiple layers. A planar conductor of a capacitor may comprise a planar plate. A planar plate may be patterned on a substrate in a substantially continuous circular shape about a conductor axis, though other shapes are also possible.

A first conductor and a second conductor of a micro-scale passive device may be held at different voltage potentials, such as during operation of the device. Because of the different voltage potentials of the first conductor and the second conductor, an electric field may develop between the first conductor and the second conductor. An electric field may occur in a transformer due to parasitic capacitance between coils of the transformer. An electric field may occur in a capacitor due to operation of the capacitor.

An electric field between a first conductor and a second conductor of a micro-scale passive device may include a point having a maximum electric field. For example, a point having a maximum electric field may occur at an edge of one of the conductors of a micro-scale passive device. The maximum electric field between the first conductor and the second conductor may be many times greater than a uniform (e.g., average) electric field between the first conductor and the second conductor, for example, by a factor of about 3, 4, 5, or another number of times greater. The inventors have recognized that electric fields in electronic devices may cause undesirable effects on electrical components. The inventors have recognized that a maximum electric field in electronic devices may be a point of particularly undesirable effects for electrical components. When the maximum electric field matches or exceeds a breakdown electric field of a device, the device may rapidly age or breakdown. The rapid aging or breakdown of the device may first occur at or around the point at which the maximum electric field occurs.

The inventors have recognized that as the maximum electric field appearing between a first conductor and a second conductor increases, the lifespan of the micro-scale passive device may decrease. Because the maximum electric field may be a factor of times greater than the uniform electric field, the lifespan of the micro-scale passive device may also decrease as the uniform electric field increases. The value of the uniform electric field that results in the maximum electric field matching the breakdown electric field of a device may be referred to as a threshold electric field. This threshold electric field may be imposed as on operating limitation of the device, and may for example, impose voltage and/or frequency limitations on operation of the device. Accordingly, the inventors have recognized that increasing the breakdown electric field of a micro-scale passive device or decreasing the maximum electric field may increase the lifespan of the micro-scale passive device and/or may allow the micro-scale passive device to operate at a higher threshold electric field. Devices described herein may have insulator layers forming isolation layers or encapsulation layers that have improved properties that increase the lifespan of the device and/or allow the device to operate at higher threshold electric fields.

The inventors have recognized that providing insulative particles within an insulator layer of a micro-scale passive device can increase the breakdown electric field within the micro-scale passive device. Using insulative particles within an insulator layer to increase the breakdown electric field of a micro-scale passive device may increase the lifespan of the micro-scale passive device and/or may allow the micro-scale passive device to operate at a higher uniform electric field. For example, the insulative particles may vertically reinforce portions of an insulator layer in which they are disposed, lowering the conductivity, lowering the permittivity, and thus increasing the breakdown electric field of the insulator layer. By increasing the breakdown electric field of the insulator layer, the device may operate at a higher maximum electric field, and therefore a higher threshold electric field. Accordingly, aspects of the present disclosure provide micro-scale passive devices having insulative particles within an insulator layer.

The inventors have recognized that providing conductive particles or nonlinear conductive particles (for example, particles that exhibit a higher conductivity when subjected to a higher electric field) within an insulator layer of a micro-scale passive device can reduce the maximum electric field within the micro-scale passive device. Using conductive or nonlinear conductive particles within an insulator layer to decrease the maximum electric field of a micro-scale passive device may increase the lifespan of the micro-scale passive device and/or may allow the micro-scale passive device to operate at a higher uniform electric field. For example, the conductive or nonlinear conductive particles may functionalize portions of an insulator layer in which they are disposed as a lateral field grading layer, increasing the conductivity, and lowering maximum electric field within the device. By lowering maximum electric field within the device, the device may operate at a higher uniform electric field and therefore a higher threshold electric field. Accordingly, aspects of the present disclosure provide micro-scale passive devices having conductive or nonlinear conductive particles within an insulator layer.

II. Insulative Particles

FIG. 1 shows a cross-sectional side view of a micro-scale passive device 100. Micro-scale passive device 100 is arranged on a device substrate 102 having an upper surface 104, and includes a layer 106, an insulator layer 108, a conductor 110, a conductor 112, and insulative particles 116. The insulator layer 108 of micro-scale passive device 100 and the particles therein may be configured to increase a breakdown electric field of the micro-scale passive device 100.

Micro-scale passive device 100 may comprise one of various micro-scale passive devices. In some embodiments, micro-scale passive device 100 comprises a transformer. In the exemplary embodiment illustrated by FIG. 1, micro-scale passive device 100 is shown as a transformer having conductor 110 arranged as a coil and having conductor 112 also arranged as a coil. In some embodiments, micro-scale passive device 100 comprises a capacitor. In embodiments where micro-scale passive device 100 comprises a capacitor, conductor 110 may be arranged as a plate and conductor 112 may also be arranged as a plate. In some embodiments, micro-scale passive device 100 comprises an inductor. In some embodiments, micro-scale passive device 100 comprises an isolator or an isolated micro-scale passive device, for example, an isolated transformer or an isolated capacitor.

In the exemplary embodiment of FIG. 1, device substrate 102 is illustrated as including semiconductor substrate 120, conductive layer 120, and insulative layer 122, and has an upper surface 104. The conductive layer 120 may comprise a top integrated circuit metallization layer, and the insulative layer 122 may comprise an integrated circuit passivation layer. The upper surface 104 may be substantially planar. The upper surface 104 of the device substrate 102 is arranged between the device substrate 102 and other components of micro-scale passive device 100, such as layer 106.

According to aspects of the present application, a substrate, such as device substrate 102, may comprise various materials. In some embodiments, a substrate may comprise a semiconductor material. For example, device substrate 102 includes semiconductor substrate 120. A substrate may comprise a bulk or monocrystalline semiconductor substrate, such as a bulk or monocrystalline silicon substrate. In some embodiments, a substrate may comprise a deposited semiconductor substrate, such as polycrystalline silicon. In some embodiments, a substrate may comprise a silicon-on-insulator substrate or may comprise a buried oxide layer. Other semiconductor materials may be used as substrates. In some embodiments, a substrate, such as device substrate 102, may comprise a glass substrate or a printed circuit board (PCB).

The micro-scale passive device 100 includes a conductor 110. In some embodiments, the conductor 110 comprises a planar conductor. In the illustrative embodiment of FIG. 1, the conductor 110 is arranged on layer 106. In some embodiments, the layer 106 may comprise an insulator layer, and/or may comprise a portion of insulator layer 108.

In FIG. 1, the conductor 110 is arranged above the device substrate 102. In embodiments where micro-scale passive device 100 comprises a transformer, the conductor 110 may comprise a coil of the transformer. In embodiments where micro-scale passive device 100 comprises a capacitor, the conductor 110 may comprise a plate of the capacitor. At least one terminal of the conductor 110 may be configured to be coupled to a voltage source, and the voltage source configured to apply voltages to the conductor 110.

For example, micro-scale passive device 100 is illustrated as including terminals 118a and 118c, which may provide coupling points for conductor 110 of micro-scale passive device 100. Terminal 118c is exposed and configured to be coupled to a voltage source. Terminal 118a and/or terminal 118c may be formed from a same metallization layer as conductor 110. Micro-scale passive device 100 further includes a conductive layer 122 coupling terminal 118a to terminal 118c, and an insulative layer 124 insulating the conductive layer 120. The conductive layer 120 may comprise a top integrated circuit metallization layer, and the insulative layer 122 may comprise an integrated circuit passivation layer.

The micro-scale passive device 100 includes a conductor 112. In some embodiments, the conductor 112 comprises a planar conductor. The conductor 112 may be arranged in the insulator layer 108. The conductor 112 may be arranged over and above the conductor 110. The conductor 112 may be arranged such that the conductor 110 is configured to be arranged between the conductor 112 and the device substrate 102. In embodiments where micro-scale passive device 100 comprises a transformer, the conductor 112 may comprise a coil of the transformer. In embodiments where micro-scale passive device 100 comprises a capacitor, the conductor 112 may comprise a plate of the capacitor. At least one terminal of the conductor 112 may be configured to be coupled to a voltage source, and the voltage source configured to apply voltages to the conductor 112.

For example, micro-scale passive device 100 is illustrated as including terminal 118b, which may provide a coupling point for conductor 112 of micro-scale passive device 100. Terminal 118b is exposed and configured to be coupled to a voltage source. Terminal 118b may be formed from a same metallization layer as conductor 112.

In some embodiments, conductor 112 may comprise a first conductor and conductor 110 may comprise a second conductor. The conductor 110 and the conductor 112 may be coupled. In an exemplary embodiment where the conductor 110 is arranged on a primary side of the micro-scale passive device 100, and the conductor 112 is arranged on a secondary side of the micro-scale passive device 100, the conductor 110 may be a transmit conductor and the conductor 112 may be a receive conductor. The conductor 110 may transmit signals that are received by the conductor 112. However, each conductor may comprise either a transmit conductor arranged on a primary side or a receive conductor arranged on a secondary side. For example, in some embodiments, the conductor 112 may be arranged on a primary side as a transmit conductor and the conductor 110 may be arranged on a secondary side as a receive conductor. In transformers, transmit conductors may comprise transmit coils and receive conductors may comprise receive coils. In capacitors, transmit conductors may comprise transmit plates and receive conductors may comprise receive plates.

The conductor 110 and the conductor 112 may each be arranged about a respective conductor axis. In some embodiments, such conductor axes are normal to the upper surface 104 of the device substrate 102. In some embodiments, the conductor 110 is vertically spaced from the conductor 112 along the conductor axes. In some embodiments, the conductor 110 is disposed in a plane parallel to the upper surface 104 of the device substrate 102 and the conductor 112 is disposed in a different plane parallel to the upper surface 104 of the device substrate 102. The conductor 110 and the conductor 112 may be patterned, in their respective layers, such that the conductor 110 and the conductor 112 are respectively patterned normal to the conductor axes. In some embodiments, the conductor axes are approximately aligned with each other, or may comprise a same conductor axis.

Conductors such as coils or plates, conductive layers such as planar conductors or conductive particles, and other elements may comprise various materials. In some embodiments, conductors or conductive layers comprise conductive materials, for example, metals such as copper, gold, or aluminum, or may comprise semiconductor materials, such as doped semiconductor materials. For example, each of conductor 110 and conductor 112, including terminal 118a, terminal 118b, and terminal 118c may comprise each an approximately 6 um thick gold layer. In some embodiments, each conductor and conductive layer is arranged in a single metallization layer or is arranged in multiple metallization layers.

Micro-scale passive device includes an insulator layer 108. The insulator layer 108 is arranged at least partially between the conductor 110 and the conductor 112. In the illustrative embodiment of FIG. 1, the insulator layer 108 is shown as including insulator layer portion 108a, insulator layer portion 108b, and insulator layer portion 108c. The insulator layer portion 108a is arranged around and/or above conductor 110. The insulator layer portion 108a and the insulator layer portion 108b are arranged between the conductor 110 and the conductor 112 and may comprise an isolation layer. The insulator layer portion 108c is arranged around and/or above conductor 112 and may comprise an encapsulation layer for conductor 112. In some embodiments, layer 106 is a portion of the insulator layer 108 and may be comprise at least part of an encapsulation layer for conductor 110.

During a process of manufacture of micro-scale device 100, the insulator layer portions may be sequentially formed, for example, as follows. After layer 106 and/or substrate 102 is formed, conductor 110 may be formed on layer 106 or substrate 102. After conductor 110 is formed, insulator layer portion 108a may be formed around and/or above the conductor 110. After insulator layer portion 108a is formed, insulator layer portion 108b may be formed above the insulator layer portion 108a. In some embodiments, insulator layer portion 108a and insulator layer portion 108b may be formed as a same insulator layer portion. After insulator layer portion 108b is formed, conductor 112 may be formed above the insulator layer portion 108b. After conductor 112 is formed, insulator layer portion 108c may be formed around and/or above the conductor 112.

An insulator layer, such as layer 106 or the insulator layer 108, including each of insulator layer portion 108a, insulator layer portion 108b, and insulator layer portion 108c, may be formed of an insulating or dielectric material. In some embodiments, the insulator layer 108 may comprise a polymer such as polyimide or may comprise liquid polychlorinated biphenyls (PCBs) or an epoxy. In some embodiments, the insulator layer 108 may comprise a cured material rather than a vapor deposited material. For example, each of insulator layer portion 108a, insulator layer portion 108b, and insulator layer portion 108c may each comprise an approximately 10 um thick polyimide layer. As another example, layer 106 may comprise an approximately 5 um thick polyimide layer.

Micro-scale passive device includes insulative particles 116 within insulator layer 108. For illustrative purposes, only one insulative particle 116 is labeled. In some embodiments, insulative particles 116 may be embedded in the insulator layer 108. In some embodiments, the insulative particles 116 may be encapsulated by the insulator layer 108. For example, the insulative particles 116 may be disposed such that the insulative particle are substantially only in contact with the insulator layer 108.

At least some of the insulative particles may be arranged between the conductor 110 and the conductor 112, along the direction of the conductor axes. Additionally, at least some of the insulative particles 116 may be arranged between the conductor 110 and the conductor 112 along directions approximately perpendicular to the conductor axes.

During a process of manufacture of micro-scale device 100, conductive particles may be introduced into insulator layer 108. As described above, insulator layer 108 may be formed of a liquid material that is cured. Before insulator layer 108 is cured, the insulative particles 116 may be dispersed into the liquid material. For example, the insulative particles 116 may be introduced into a liquid polymer or solvent, or another liquid material. In some embodiments, the insulative particles 116 are mechanically dispersed into the liquid material, for example, by ultrasonication, using a planetary mixer, or using a high-shear mixer. In some embodiments, the insulative particles 116 are chemically dispersed into the liquid material, for example, using APTES or DETAS silane coupling, which may modify surfaces of insulative particles 116. After or as the insulative particles 116 are introduced into the liquid material, the layer 106, conductor 110, conductor 112, and insulator layer 108, including insulator layer portion 108a, insulator layer portion 108b, and insulator layer portion 108c may be formed in the manner described above.

In the exemplary embodiment of micro-scale passive device 100 illustrated by FIG. 1, the insulative particles 116 are shown in first region 114a, within insulator layer portion 108a and within insulator layer portion 108b, and the insulative particles 116 are not shown in second region 114b, within insulator layer portion 108c. The insulative particles 116 in first region 114a, within insulator layer portion 108a and within insulator layer portion 108b may form a portion of the isolation layer between conductor 110 and conductor 112.

The conductive particles 116 may be distributed throughout the regions and throughout the portions of insulator layer 108 and in which they are disposed, which in the illustrative embodiment of FIG. 1, is first region 114a and within insulator layer portion 108a and within insulator layer portion 108b. In some embodiments, the conductive particles 116 may be distributed substantially evenly. In some embodiments, the conductive particles 116 may be distributed substantially from a top to a bottom of the regions, and from a lower surface to an upper surface of the one or more layers or layer portions in which they are disposed.

An electric field may develop between the conductor 110 and the conductor 112, for example during operation of micro-scale passive device 100. In both embodiments where the micro-scale passive device 100 comprises a transformer and embodiments where the micro-scale passive device 100 comprises a capacitor, when a voltage is applied between the conductor 110 and the conductor 112 by a voltage source, an electric field may develop between the conductor 110 and the conductor 112. In various embodiments, a voltage source may apply one or more of AC signals, DC signals, or a combination thereof, across the conductor 110 and the conductor 112.

An electric field between conductor 110 and conductor 112 may be a result of a voltage differential between the conductor 110 and the conductor 112. In some embodiments, an electric field occurs when micro-scale passive device 100 comprises a capacitor due to operation of the capacitor. In some embodiments, an electric field occurs when micro-scale passive device 100 comprises a transformer due to parasitic capacitance between coils, for example, planar coils, of the transformer. Within the electric field, there may be a point having a maximum electric field, which may for example, occur and an edge of one of conductor 110 or conductor 112.

In some embodiments, the insulative particles may comprise at least one of $SiO_2$, $Al_2O_3$, $SiN_x$ or another insulative material. The insulative particles may comprise approximately spherical shapes. In some embodiments, the insulative particles may comprise nanoparticles. For example, the insulative particles may have a size (e.g., diameter) between 1 nm and 20 nm, or between 5 nm and 12 nm.

In various embodiments, insulative particles may have a permittivity between 3.5 and 10. In various embodiments, insulative particles may have a conductivity between $1\times10^{-18}$ S/cm and $1\times10^{-10}$ S/cm. In some embodiments, insulative particles, for example, $SiO_2$ particles, may have a permittivity between 3.5 and 4.5 and/or may have a conductivity between $1\times10^{-18}$ S/cm and $1\times10^{-12}$ S/cm. In some embodiments, insulative particles, for example, $Al_2O_3$ particles, may have a permittivity between 7 and 10 and/or a conductivity between $1\times10^{-18}$ S/cm and $1\times10^{-10}$ S/cm. In some embodiments, insulative particles, for example, $SiN_x$ particles, may have a permittivity between 5 and 8 and/or a conductivity between $1\times10^{-18}$ S/cm and $1\times10^{-10}$ S/cm.

In some embodiments, a bandgap of insulative particles may be higher than a bandgap of an insulator layer (such as a polymer material) in which the insulative particles are disposed. For example, for an insulator layer formed of polyimide, having a bandgap of 2 eV, the insulative particles may have a bandgap that is higher than 2 eV. In various embodiments, insulative particles, such as oxides, may have a bandgap higher than 2 eV. In some embodiments, insulative particles may have a bandgap equal to or higher than 5 eV.

In some embodiments, particles may be disposed in an insulator layer having a particle density between 2 and 6 g/cm³. In some embodiments a particle-to-particle distance in an insulator layer may between one particle size to thousands of particle sizes, where particle size may comprise an average diameter of the particles.

Figure 2:
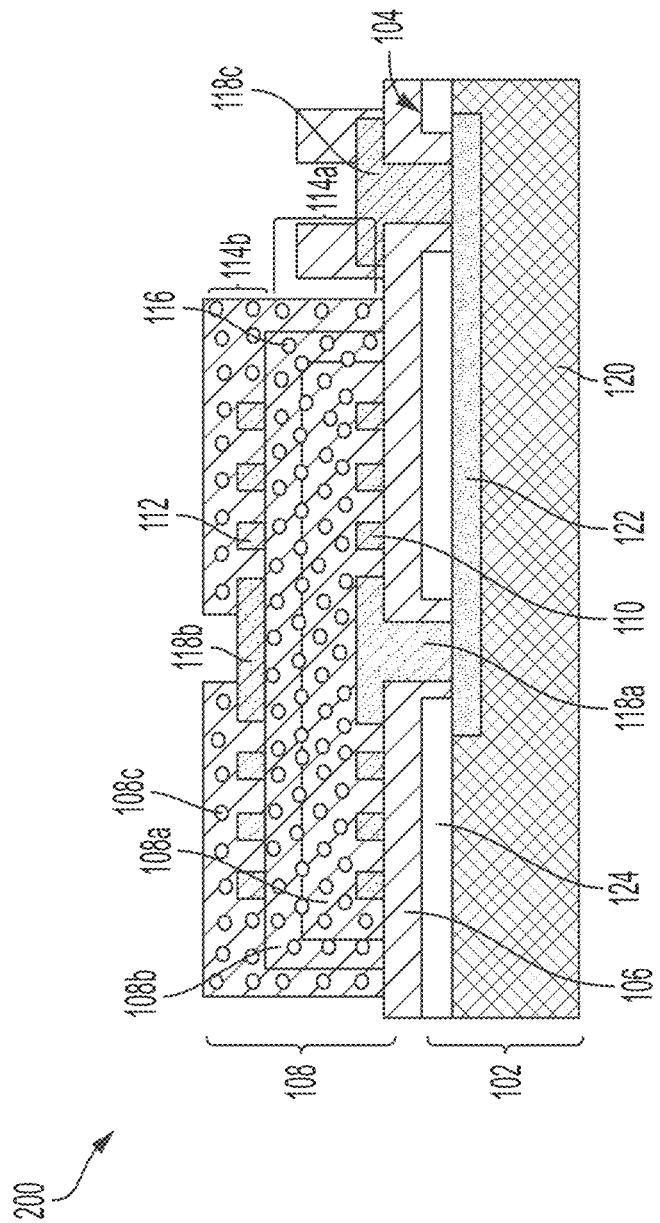
FIG. 2 is a cross-sectional side view of another micro-scale passive device, in accordance with some embodiments.

FIG. 2 shows a cross-sectional side view of a micro-scale passive device 200. Micro-scale passive device 200 comprises an alternative arrangement of insulator layer 108 and the particles within insulator layer 108. The insulator layer 108 of micro-scale passive device 200 and the particles therein may be configured to increase a breakdown electric field of the micro-scale passive device 200.

Micro-scale passive device 200 is arranged on a device substrate 102 having an upper surface 104, and includes a layer 106, an insulator layer 108, a conductor 110, a conductor 112, insulative particles 116, terminal 118a, terminal 118b, and terminal 118c. Insulator layer 108 includes insulator layer portion 108a, insulator layer portion 108b, and insulator layer portion 108c. Device substrate 102 includes semiconductor substrate 120, conductive layer 120, and insulative layer 122.

Micro-scale passive device 200 shown in FIG. 2 differs from micro-scale passive device 100 shown in FIG. 100 in its arrangement of insulative particles 116. In the exemplary embodiment of micro-scale passive device 200 illustrated by FIG. 2, the insulative particles 116 are shown in first region 114a, within insulator layer portion 108a and within insulator layer portion 108b, and the insulative particles 116 are shown in second region 114b, within insulator layer portion 108c. The insulative particles 116 in second region 114b, within insulator layer portion 108c, may form a portion of the encapsulation layer around and/or above conductor 112.

Insulative particles, such as insulative particles 116, disposed within an isolation layer and/or an encapsulation layer, may be configured to increase the breakdown electric field of the micro-scale passive device 100 or micro-scale passive device 200. The insulative particles may reduce a conductivity of an isolation layer. By reducing the conductivity of the isolation layer, the isolation layer may be vertically reinforced. The insulative particles 116 may also be more robust at high electric field, which may cause an enhancement in the intrinsic breakdown electric field within the insulation layer. In addition, an insulator layer may have a lower dipolar orientation due to the insulative particles, and may provide a lower permittivity of the insulator layer. The enhanced intrinsic breakdown electric field and reduced permittivity may each contribute to the increased breakdown electric field of the device. In some embodiments, insulative particles may increase the breakdown electric field without increasing a height of the isolation layer, allowing a micro-scale device that includes the insulative particles to have a compact size.

Figure 6A:
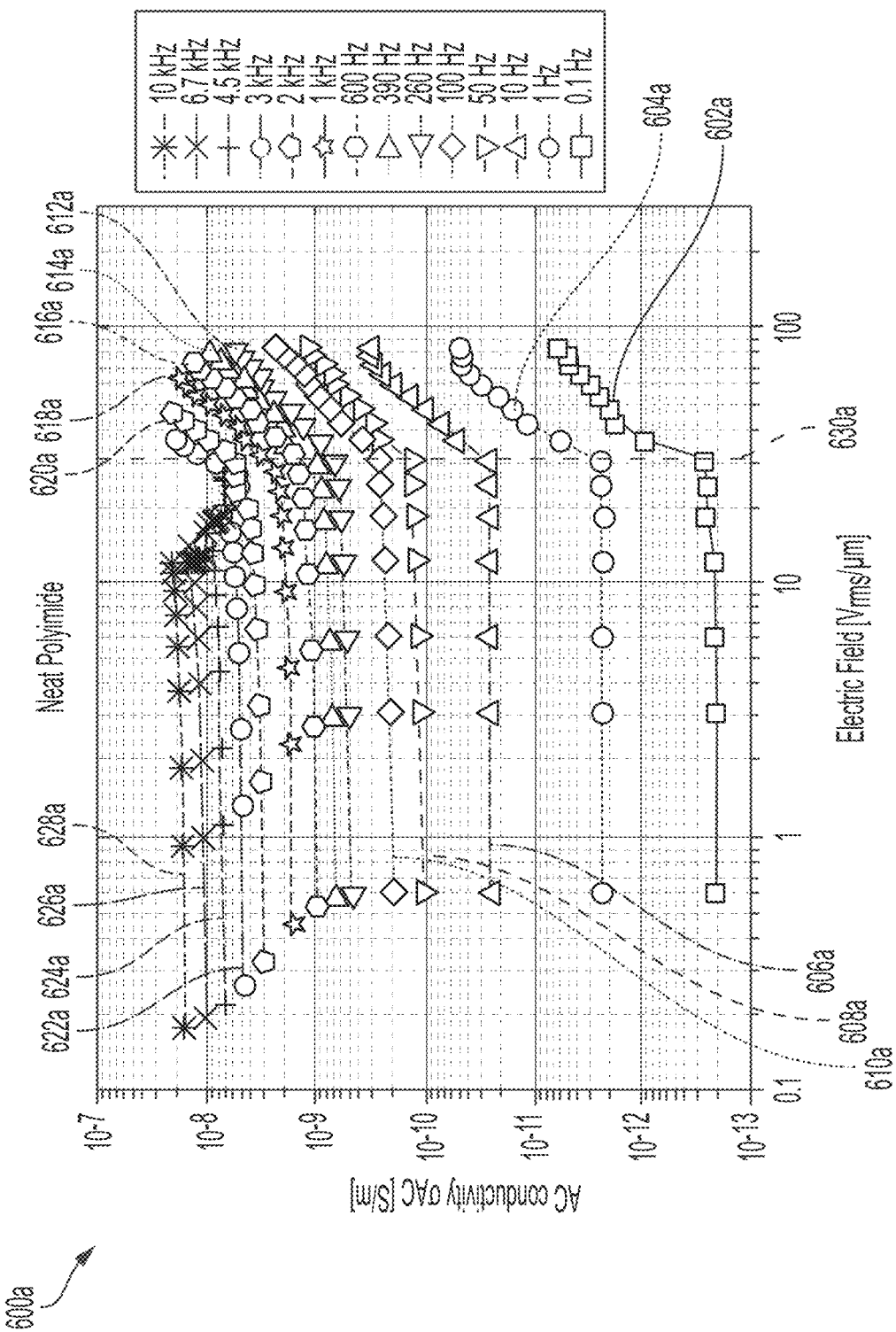
FIG. 6A is a plot illustrating conductivity and electric field of an insulator layer of a micro-scale passive device, in accordance with some embodiments.
Figure 6B:
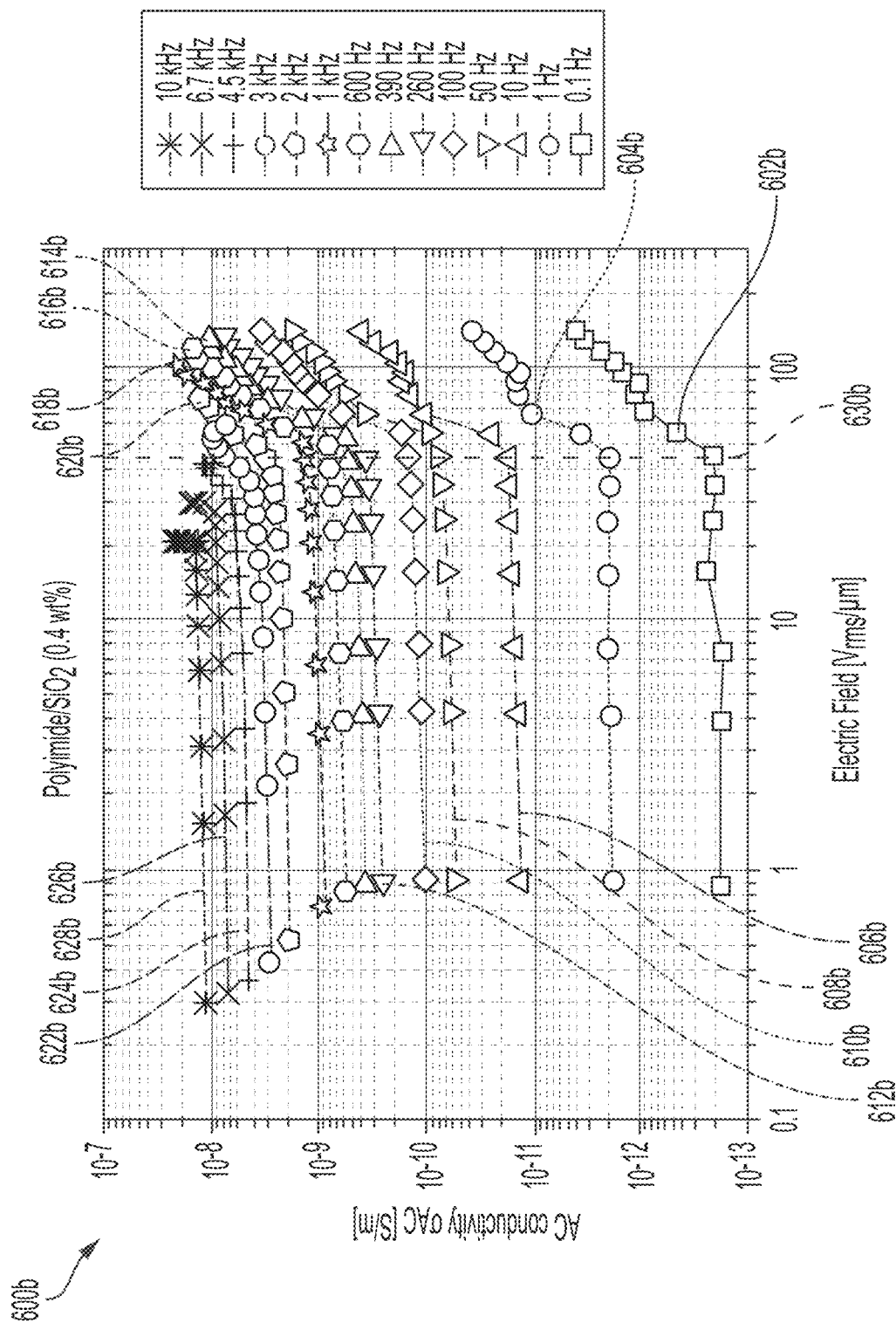
FIG. 6B is another plot illustrating conductivity and electric field of an insulator layer of a micro-scale passive device, in accordance with some embodiments.

FIG. 6A shows a plot 600a illustrating conductivity and electric field of an insulator layer comprising neat polyimide having 0% percent weight $SiO_2$ content, and FIG. 6B shows a plot illustrating conductivity and electric field of an insulator layer comprising polyimide having 0.4% percent weight $SiO_2$ content. The layers corresponding to FIG. 6A and FIG. 6B may be included in a micro-scale passive device. For example, insulator layers with such insulative particle content may be included in micro-scale passive device 100. Plot 600a and 600b have horizontal axes representing electric field in root mean square volts per micron and vertical axes representing alternating current (AC) conductivity in siemens per meter. Different curves in plot 600a and plot 600b represent different frequencies.

Plot 600a and plot 600b include curves for different frequencies plotting points of conductivity for various electric fields. Plot 600a includes curve 602a for 0.1 Hz, curve 604a for 1 Hz, curve 606a for 10 Hz, curve 608a for 50 Hz, curve 610a for 100 Hz, curve 612a for 260 Hz, curve 614a for 390 Hz, curve 616a for 600 Hz, curve 618a for 1 kHz, curve 620a for 2 kHz, curve 622a for 3 kHz, curve 624a for 4.5 kHz, curve 626a for 6.7 kHz, and curve 628a for 10 kHz. Plot 600b includes curve 602b for 0.1 Hz, curve 604b for 1 Hz, curve 606b for 10 Hz, curve 608b for 50 Hz, curve 610b for 100 Hz, curve 612b for 260 Hz, curve 614b for 390 Hz, curve 616b for 600 Hz, curve 618b for 1 kHz, curve 620b for 2 kHz, curve 622b for 3 kHz, curve 624b for 4.5 kHz, curve 626b for 6.7 kHz, and curve 628b for 10 kHz.

A threshold electric field may be determined to be a value of electric field where conductivity begins to substantially increase as electric field increases. The threshold electric field may represent the beginning of material degradation for materials of a micro-scale passive device, such as degradation of an insulator layer of the device. Plot 600a shows a threshold electric field of 630a of about 30 volts per micron and plot 600b shows a threshold electric field of 630b of greater than about 40 volts per micron. In the operation regions to the left of a threshold electric field, a micro-scale passive device may experience ohmic conduction and may be subjected to little to no aging of components. In the operation regions to the right of a threshold electric field, a micro-scale passive device may experience injection and space charge and may be subjected to aging of components. Plot 600a and 600b show that for the insulator layer having 0.4 percent weight, compared to the neat polyimide having 0 percent weight, the threshold electric field increases for a given frequency. The insulative particles are more robust under high electric field, which may cause the threshold electric field to be shifted towards higher field, and there may be lower injection and space charge due to the insulative particles. Using plot 600a and plot 600b, threshold electric field may be adjusted by controlling the percent weight in a micro-scale passive device, such as micro-scale passive device 100.

Figure 7:
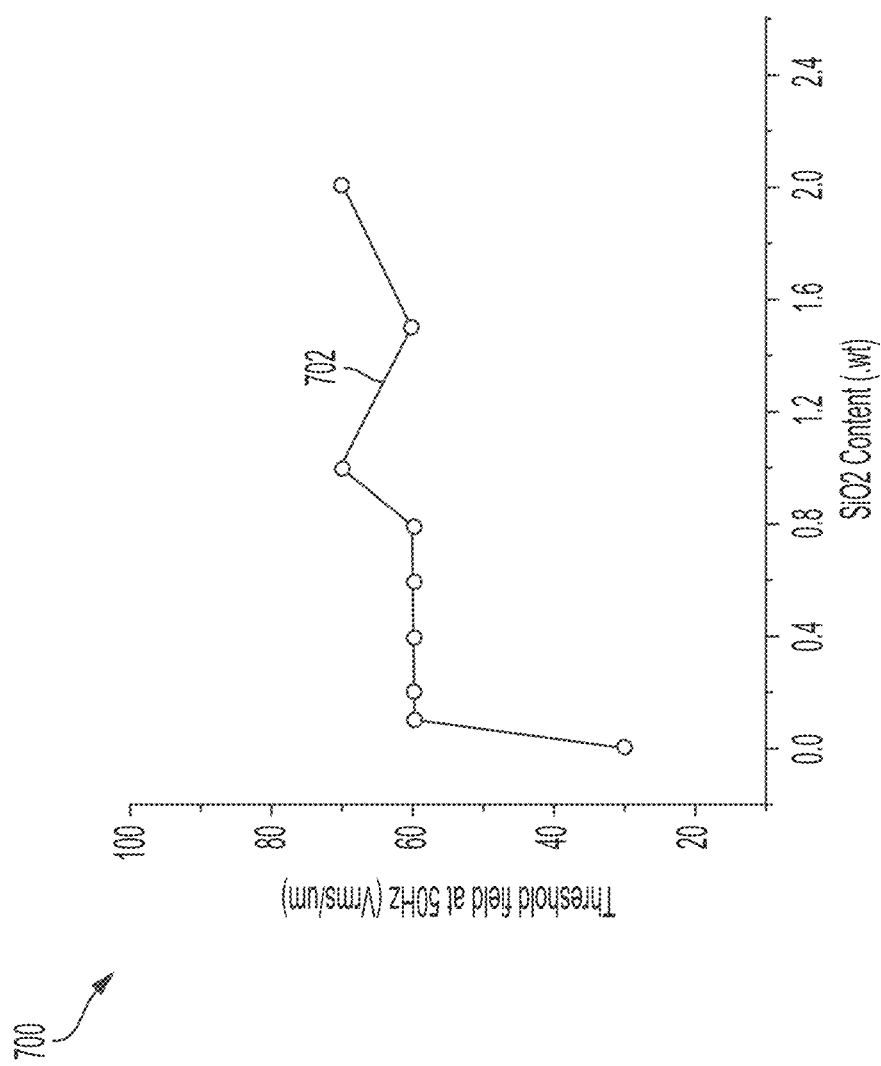
FIG. 7 is a plot illustrating electric field and insulative particle content of an insulator layer of a micro-scale passive device, in accordance with some embodiments.

FIG. 7 shows a plot 700 illustrating electric field and insulative particle content of an insulator layer of a micro-scale passive device. For example, an insulator layer with such insulative particle content may be included in micro-scale passive device 100. Plot 700 has a horizontal axis representing $SiO_2$ content of an insulator layer in percent weight and a vertical axis representing threshold electric field in root mean square volts per micron at a frequency of 50 Hz.

Plot 700 includes curve 702 plotting points of threshold electric field for various percent weights. Plot 700 shows that, generally, as percent weight is increased, the threshold electric field increases. For example, the threshold electric field may be increased by about or greater than about 2-3 times compared to an insulator layer with 0 percent weight insulative particles. The insulative particles may be more robust under high electric field, which may cause the threshold electric field to be shifted towards higher electric field. Using plot 700, threshold electric field may be adjusted by controlling the percent weight to provide an increased threshold electric field in a micro-scale passive device, such as micro-scale passive device 100.

Figure 8:
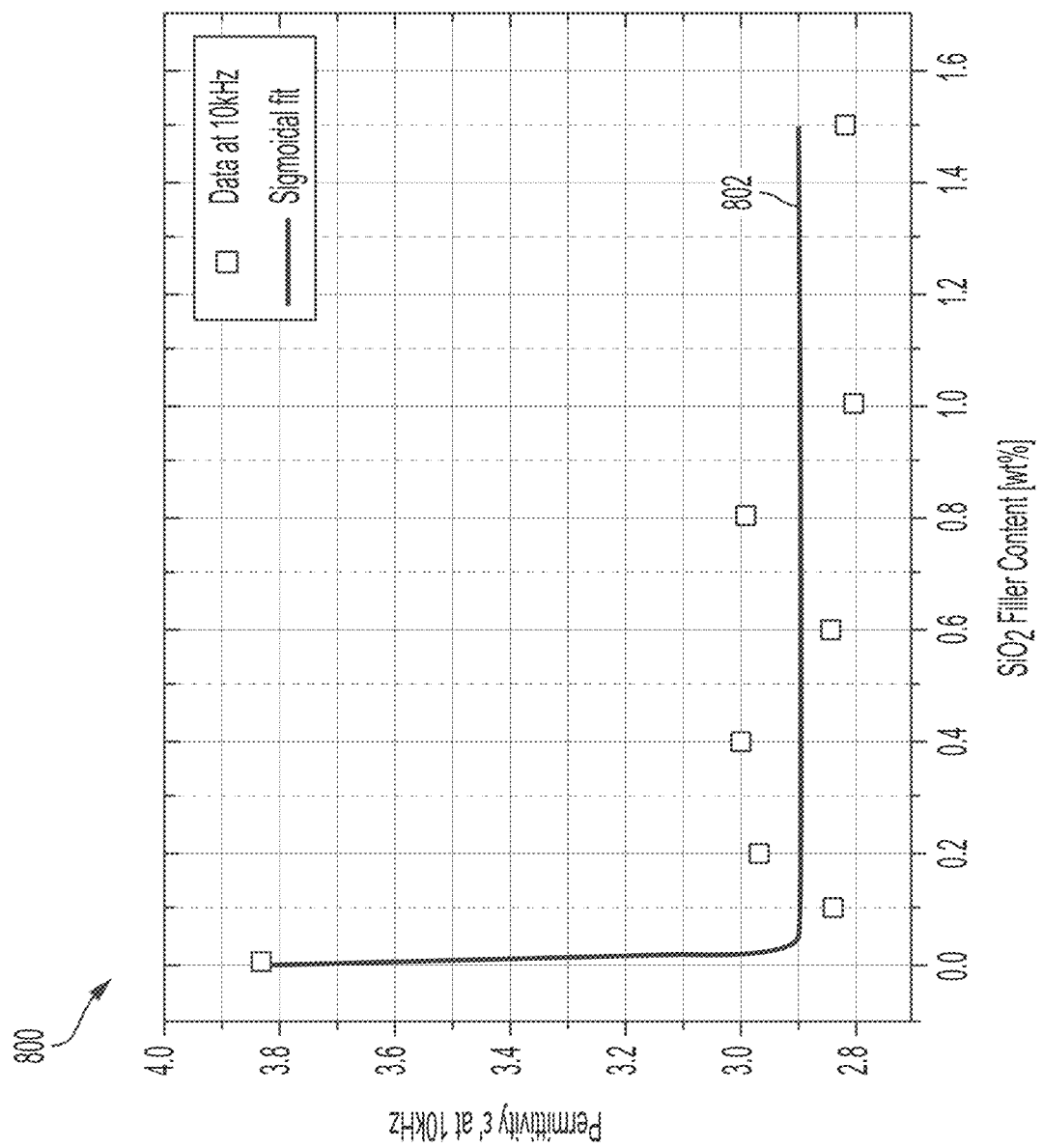
FIG. 8 is a plot illustrating permittivity and insulative particle content of an insulator layer of a micro-scale passive device, in accordance with some embodiments.

FIG. 8 shows a plot 800 illustrating permittivity and insulative particle content of an insulator layer of a micro-scale passive device. For example, an insulator layer with such insulative particle content may be included in micro-scale passive device 100. Plot 800 has a horizontal axis representing $SiO_2$ content of an insulator layer in percent weight and a vertical axis representing permittivity at a frequency of 10 kHz.

Plot 800 includes curve 802 with a sigmoidal fit to plotted points of permittivity for various percent weights. Plot 800 shows that, generally, as percent weight is increased, the permittivity increases. An insulator layer may have a lower dipolar orientation due to the insulator layers which may provide the lower permittivity. Lower permittivity of an insulator layer may increase a breakdown electric field of the insulator layer. Using plot 800, permittivity may be adjusted by controlling the percent weight to provide an increased breakdown electric field, and therefore an increased threshold electric field, in a micro-scale passive device, such as micro-scale passive device 100.

Figure 9:
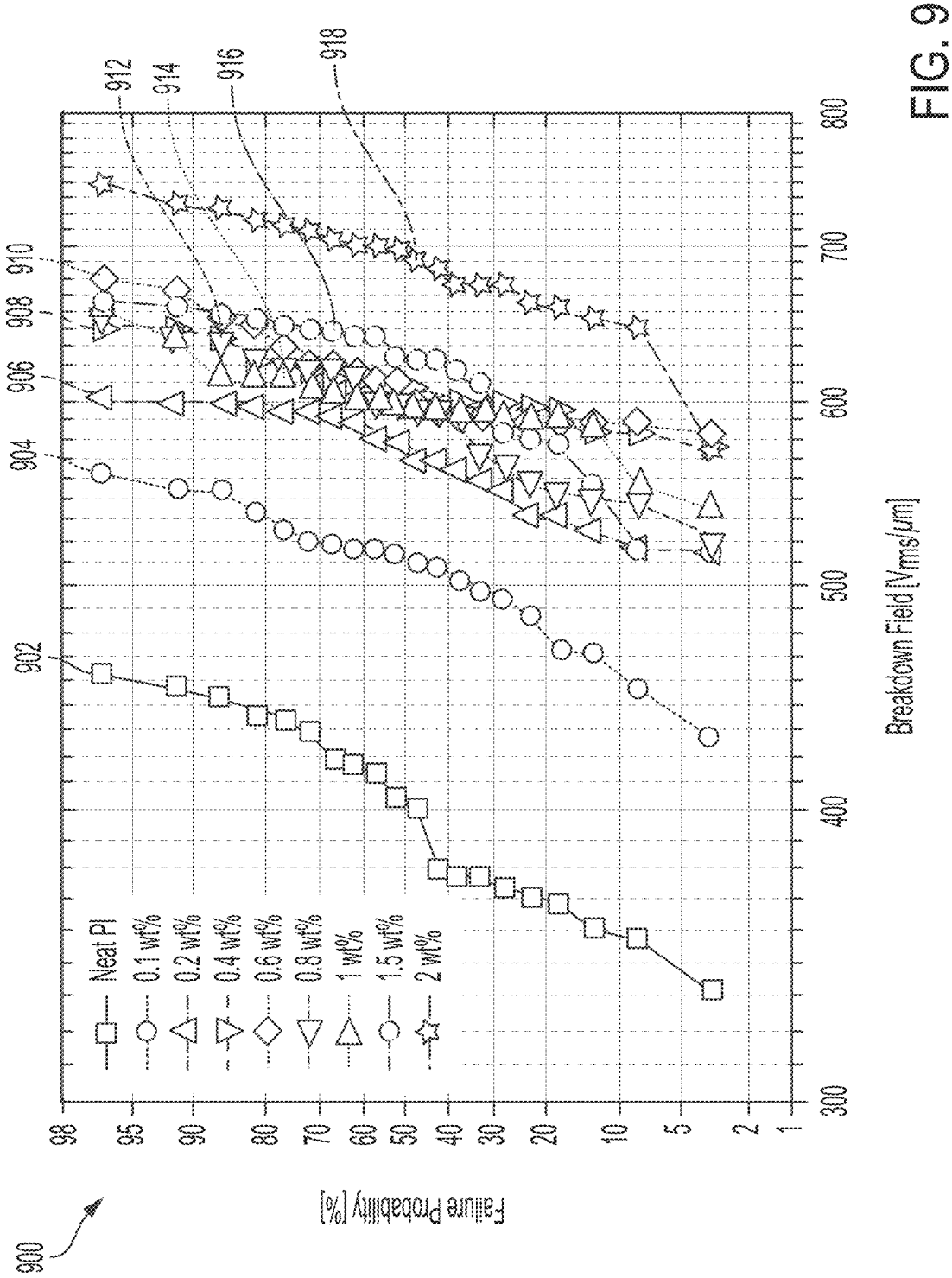
FIG. 9 is a plot illustrating failure probability and electric field of insulator layers of micro-scale passive devices, in accordance with some embodiments.

FIG. 9 shows a plot 900 illustrating failure probability and electric field of insulator layers having different $SiO_2$ content in percent weight. For example, insulator layers with such insulative particle content may be included in micro-scale passive device 100. Plot 900 has a horizontal axis representing breakdown electric field in root mean square volts per micron and a vertical axis representing failure probability in percent. Different curves in plot 900 represent different $SiO_2$ content of insulator layers in percent weight.

Plot 900 includes curves for different percent weights plotting points of failure probability for various different breakdown electric fields. Plot 900 includes curve 902 for neat polyimide having 0 percent weight $SiO_2$ content, curve 904 having 0.1 percent weight, curve 906 having 0.2 percent weight, curve 908 having 0.4 percent weight, curve 910 having 0.6 percent weight, curve 912 having 0.8 percent weight, curve 914 having 1 percent weight, curve 916 having 1.5 percent weight, and curve 918 having 2 percent weight. Plot 900 shows that, generally, as percent weight is increased, failure probability decreases for a given breakdown electric field. The insulative particles may be more robust at high electric field, which may cause an enhancement in the intrinsic breakdown electric field. Using plot 900, failure probability and breakdown electric field may be adjusted by controlling the percent weight to provide a reduced failure probability and/or an increased breakdown electric field, and therefore an increased threshold electric field, in a micro-scale passive device, such as micro-scale passive device 100.

Figure 10:
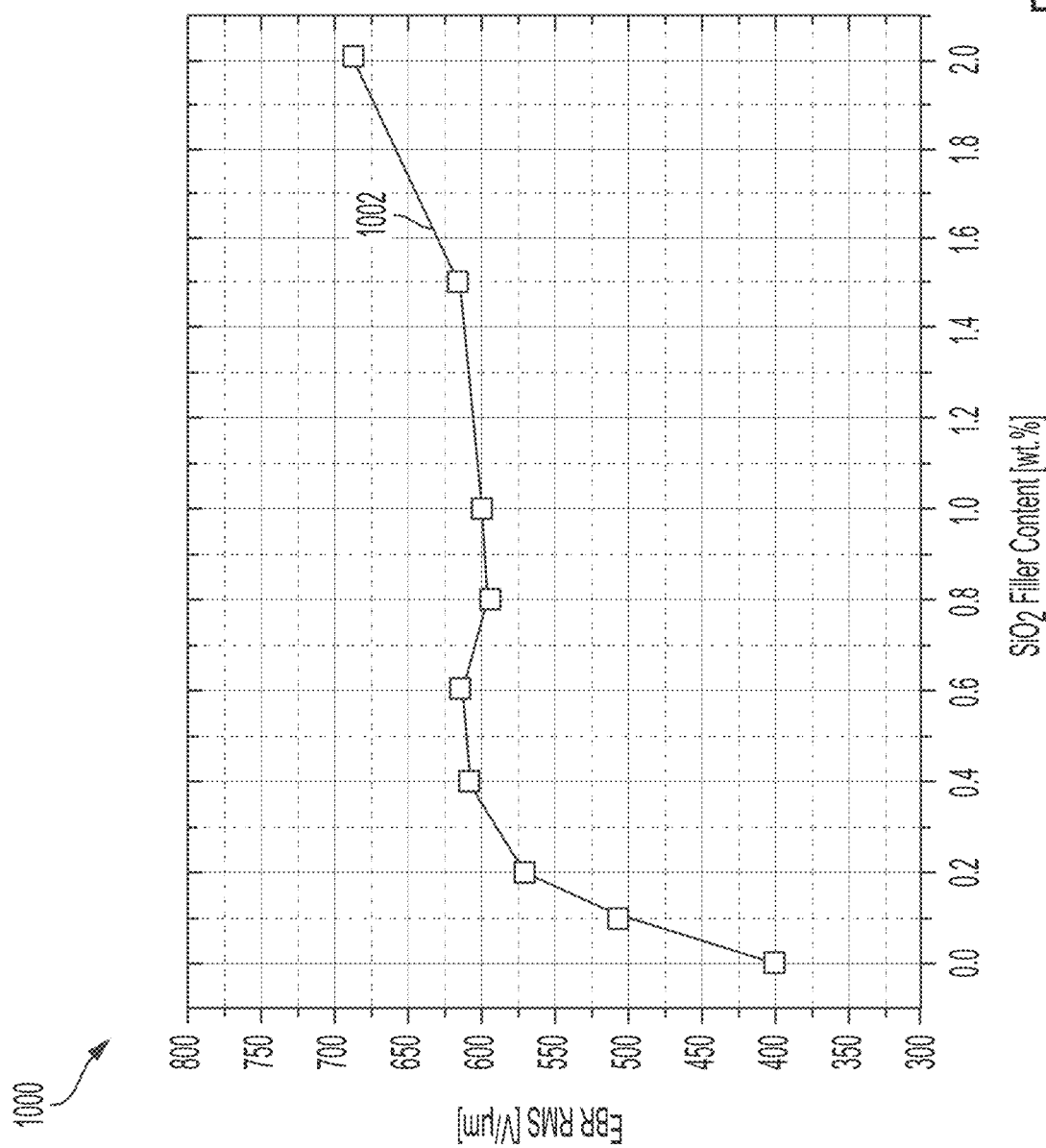
FIG. 10 is a plot illustrating electric field and insulative particle content of an insulator layer of a micro-scale passive device, in accordance with some embodiments.

FIG. 10 shows a plot 1000 illustrating electric field and insulative particle content of an insulator layer of a micro-scale passive device. For example, an insulator layer with such insulative particle content may be included in micro-scale passive device 100. Plot 1000 has a horizontal axis representing $SiO_2$ content of an insulator layer in percent weight and a vertical axis representing root mean square breakdown electric field in volts per micron.

Plot 1000 includes curve 1002 plotting points of root mean square breakdown electric field for various percent weights. Plot 1000 shows that, generally, as percent weight is increased, the root mean square breakdown electric field increases. For example, the breakdown electric field may be increased by about or greater than about 1.5-2 times compared to an insulator layer with 0 percent weight insulative particles. The insulative particles may be more robust at high electric field, which may cause an enhancement in the intrinsic breakdown electric field. Using plot 1000, root mean square breakdown electric field may be adjusted by controlling the percent weight to provide an increased breakdown electric field, and therefore an increased threshold electric field, in a micro-scale passive device, such as micro-scale passive device 100.

III. Conductive or Nonlinear Conductive Particles

Figure 3:
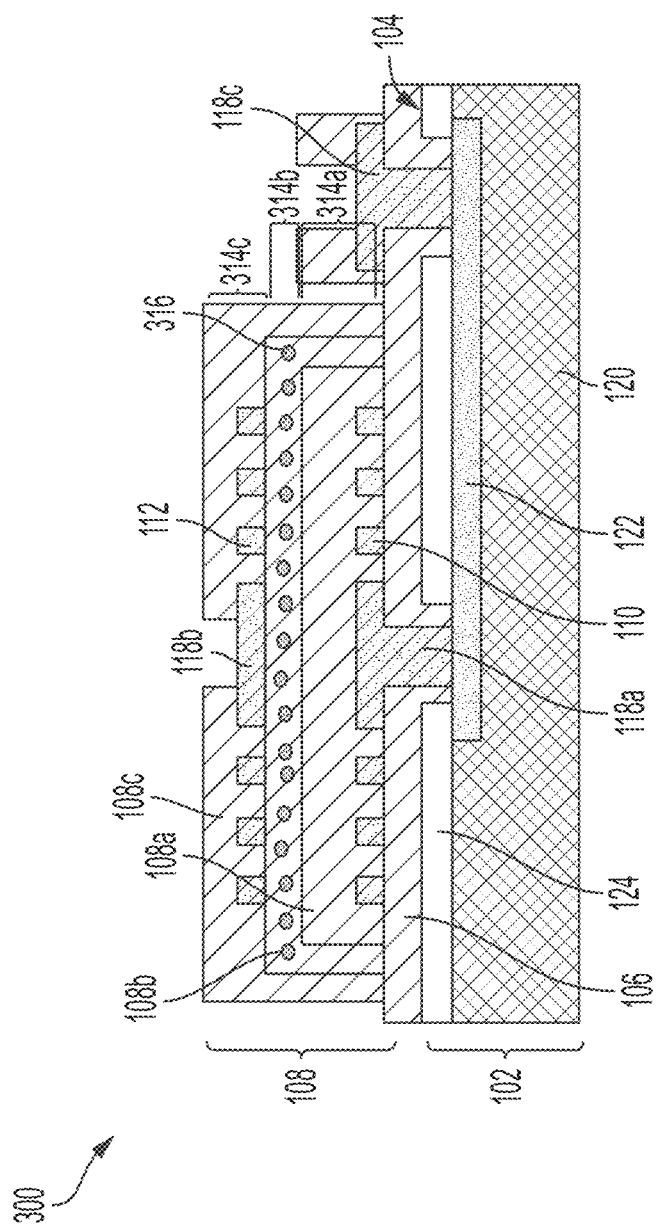
FIG. 3 is a cross-sectional side view of yet another micro-scale passive device, in accordance with some embodiments.

FIG. 3 shows a cross-sectional side view of a micro-scale passive device 300. Micro-scale passive device 300 comprises an alternative arrangement of insulator layer 108 and the particles within insulator layer 108. The insulator layer 108 of micro-scale passive device and the particles therein may be configured to decrease a maximum electric field of the micro-scale passive device 300.

Micro-scale passive device 300 is arranged on a device substrate 102 having an upper surface 104, and includes a layer 106, an insulator layer 108, a conductor 110, a conductor 112, conductive or nonlinear conductive particles 316, terminal 118a, terminal 118b, and terminal 118c. Insulator layer 108 includes insulator layer portion 108a, insulator layer portion 108b, and insulator layer portion 108c. Device substrate 102 includes semiconductor substrate 120, conductive layer 120, and insulative layer 122.

Micro-scale passive device 300 shown in FIG. 3 differs from micro-scale passive device 100 shown in FIG. 100 in that it includes conductive or nonlinear conductive particles 316 rather than insulative particles 116. In the exemplary embodiment of micro-scale passive device 300 illustrated by FIG. 3, the conductive or nonlinear conductive particles 316 are shown in second region 314b, within insulator layer portion 108b, and the conductive or nonlinear conductive particles 316 are not shown in first region 314a or third region 314c, within insulator layer portion 108a or insulator layer portion 108c. The conductive or nonlinear conductive particles 316 in second region 114b, within insulator layer portion 108b, may form a portion of a barrier layer below and/or around conductor 112. The conductive or nonlinear conductive particles 316 may form a thin barrier layer, for example, a barrier layer having a thickness of about or less than about 10 um.

Layer portions in which the conductive or nonlinear conductive particles 316 are disposed may have different conductivities than layer portions in which conductive or nonlinear conductive particles 316 are not disposed. For example, layer portions with conductive or nonlinear conductive particles 316 may have a higher conductivity than layer portions without conductive or nonlinear conductive particles 316.

In some embodiments, the conductive or nonlinear conductive particles may comprise at least one of SiC, ZnO, $Ag_2C_2$, graphene, carbon nanotubes, a negative temperature coefficient (NTC) material, or another conductive or nonlinear conductive material. The conductive or nonlinear conductive particles may comprise approximately spherical shapes. In some embodiments, conductive or nonlinear conductive particles may comprise nonspherical shapes, such as approximately two-dimensional shapes. In some embodiments, the insulative particles may comprise nanoparticles. For example, the insulative particles may have a size (e.g., diameter) between 1 nm and 1 um, between 1 nm and 600 nm, between 1 nm and 50 nm, between 1 nm and 20 nm, or between 1 nm and 8 nm. In embodiments where the conductive or nonlinear conductive particles comprise SiC or ZnO nonlinear conductive particles, the particles may have submicron-scale particle sizes (e.g., between 1 nm and 1 um, between 1 nm and 600 nm) because for particles with lower conductivity, larger particle size may be used to develop similar effects as effects of conductive particles. In some embodiments, the conductive or nonlinear conductive particles may have a maximum size that is 10% of a thickness an insulator layer, such as 10% of a thickness of a polyimide layer. In embodiments where the conductive or nonlinear conductive particles comprise nonspherical shapes or approximately two-dimensional shapes, such as when the particles comprise graphene or carbon nanotubes, the sizes listed above may correspond to a largest dimension of the particles, and the particles may have a thickness of about or less than about 1 nm. In embodiments where the conductive or nonlinear conductive particles comprise graphene, the graphene may be exfoliated to be sized to the dimensions described above.

In various embodiments, conductive or nonlinear conductive particles may have a conductivity between $1 \times 10^{-8}$ S/m and 100 MS/m. In some embodiments, conductive particles, for example, flake, tube, cage, or layer-like graphene or carbon nanotubes, may have a conductivity between 10 S/m and 100 MS/m. In some embodiments, nonlinear conductive particles, for example SiC or ZnO particles, may have a conductivity between $1 \times 10^{-8}$ S/m and 10 S/m. In various embodiments, a conductivity of conductive or nonlinear conductive particles may be higher than a conductivity of an insulator layer, for example, the conductivity of a polyimide or other polymer material layer.

In some embodiments, particles may be disposed in an insulator layer having a particle-to-particle distance and/or a volume percent concentration such that percolation is not reached (e.g., conductivity of an insulator layer with the particle is below a percolation threshold) between the high and low potential metal level, such as between first and second conductors of an isolated micro-scale passive device. Percolation may depend on particle material, and as such, particle-to-particle distance and/or a volume percent concentration may be set based on particle material.

Figure 4:
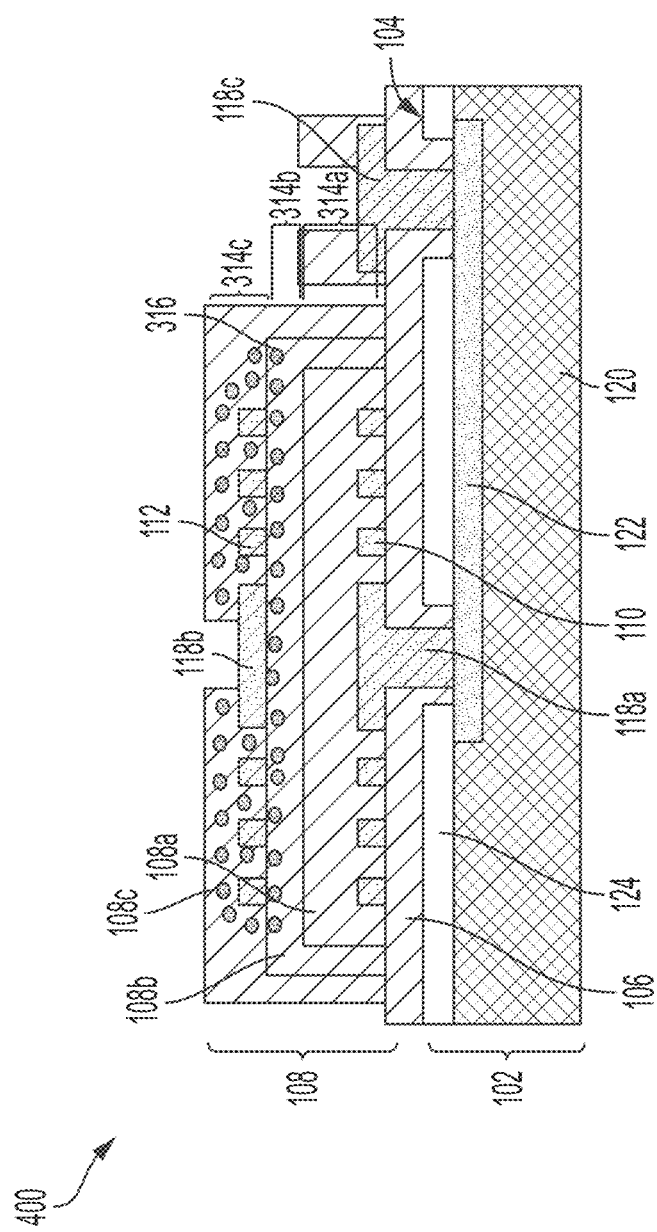
FIG. 4 is a cross-sectional side view of yet another micro-scale passive device, in accordance with some embodiments.

FIG. 4 shows a cross-sectional side view of a micro-scale passive device 400. Micro-scale passive device 400 comprises an alternative arrangement of insulator layer 108 and the particles within insulator layer 108. The insulator layer 108 of micro-scale passive device and the particles therein may be configured to decrease a maximum electric field of the micro-scale passive device 400.

Micro-scale passive device 400 is arranged on a device substrate 102 having an upper surface 104, and includes a layer 106, an insulator layer 108, a conductor 110, a conductor 112, conductive or nonlinear conductive particles 316, terminal 118a, terminal 118b, and terminal 118c. Insulator layer 108 includes insulator layer portion 108a, insulator layer portion 108b, and insulator layer portion 108c. Device substrate 102 includes semiconductor substrate 120, conductive layer 120, and insulative layer 122.

Micro-scale passive device 400 shown in FIG. 4 differs from micro-scale passive device 300 shown in FIG. 300 in its arrangement of conductive or nonlinear conductive particles 316. In the exemplary embodiment of micro-scale passive device 400 illustrated by FIG. 4, the conductive or nonlinear conductive particles 316 are shown in second region 314b, within insulator layer portion 108b, the conductive or nonlinear conductive particles 316 are shown in third region 314c, within insulator layer portion 108c, and the conductive or nonlinear conductive particles 316 are not shown in first region 314a, within insulator layer portion 108a. The conductive or nonlinear conductive particles 316 in third region 114c, within insulator layer portion 108c, may form a portion of the encapsulation layer around and/or above conductor 112. The conductive or nonlinear conductive particles 316 may form a thin encapsulation layer, for example, an encapsulation layer having a thickness of about or less than about 10 um.

Providing conductive or nonlinear conductive particles 316 within a barrier layer and/or an encapsulation layer of micro-scale device 300 or micro-scale passive device 400 may decrease a maximum electric field of the device. For example, the conductive or nonlinear conductive particles 316 may increase voltage leak or voltage spreading within the barrier layer or encapsulation layer, which may provide field grading and/or reduce concentration of electric field at any one point. By reducing concentration of the electric field at any one point, the maximum electric field of the device may be reduced as well.

In some embodiments, nonlinear conductive particles may exhibit a higher conductivity when subjected to a higher electric field. For example, nonlinear conductive particles may comprise semiconductor materials. Because the nonlinear conductive particles may exhibit a higher conductivity when subjected to a higher electric field, the particles may cause an insulator layer that includes the particles to exhibit different conductivities when subjected to different electric field. For example, when the insulator layer is subject to the uniform electric field, the insulator layer may exhibit a lower conductivity. When the insulator layer is subject to the maximum electric field, the insulator layer may exhibit a higher conductivity. By providing a variable conductivity, nonlinear conductive particles may provide an increased voltage leak or voltage spreading when electric field is high, and a reduced voltage leak or voltage spreading when electric field is low.

In some embodiments, different sections of insulator layer 108, may include different percent weights of conductive or nonlinear conductive particles. By providing different sections of insulator layer 108 with different percent weights of conductive or nonlinear conductive particles, field grading within the device may be further controlled. The different sections may be formed by different insulator layer portions or region described above or may be formed by other sectioning of the insulator layer 108.

Figure 11:
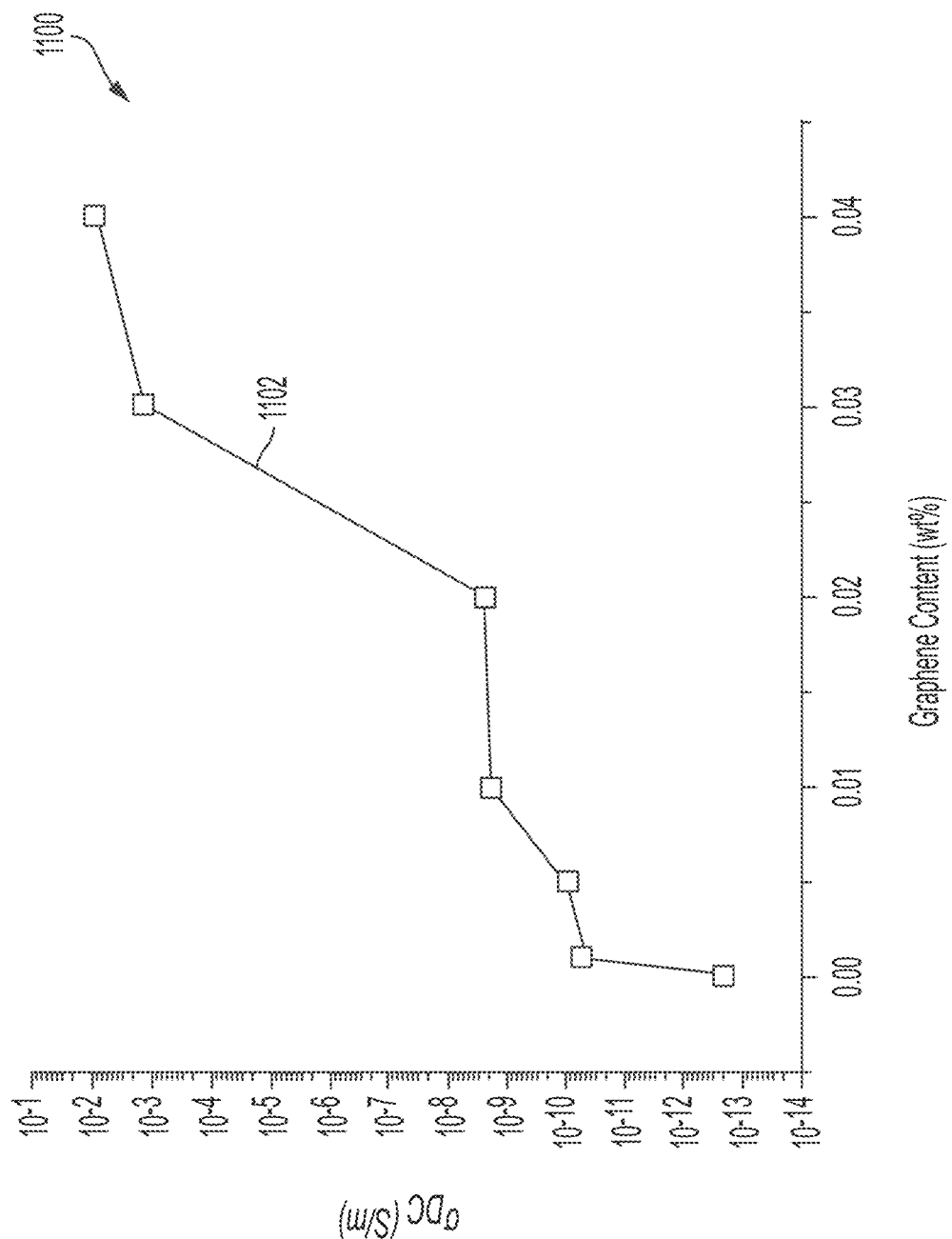
FIG. 11 is a plot illustrating conductivity and conductive particle content of an insulator layer of a micro-scale passive device, in accordance with some embodiments.

FIG. 11 shows a plot 1100 illustrating conductivity and conductive particle content of an insulator layer of a micro-scale passive device. For example, an insulator layer with such conductive particle content may be included in micro-scale passive device 300. Plot 1100 has a horizontal axis representing graphene content of an insulator layer in percent weight and a vertical axis representing conductivity for direct current in siemens per meter.

Plot 1100 includes curve 1102 plotting points of conductivity for various percent weights. Plot 1100 shows that, generally, as percent weight is increased, the conductivity increases. Using plot 1100, conductivity may be adjusted by controlling the percent weight to provide field grading and therefore reduce the maximum electric field in a micro-scale passive device, such as micro-scale passive device 300, therefore also increasing the threshold electric field and/or increasing the lifespan of the device.

Figure 5:
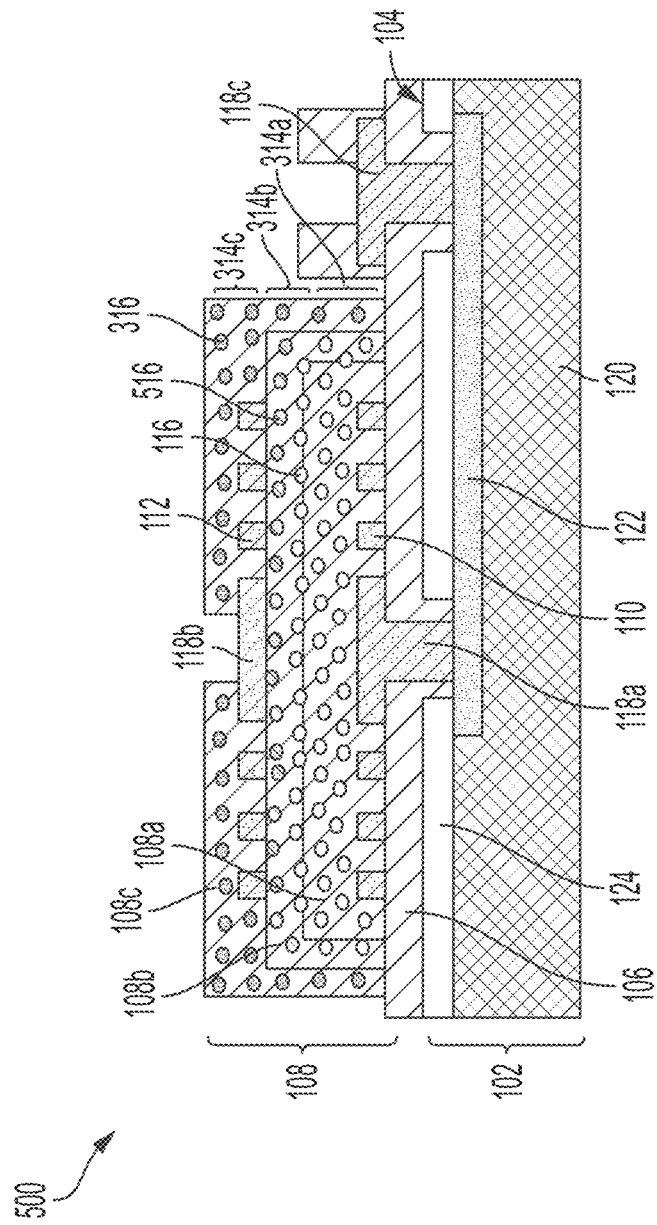
FIG. 5 is a cross-sectional side view of yet another micro-scale passive device, in accordance with some embodiments.

FIG. 5 shows a cross-sectional side view of a micro-scale passive device 500. Micro-scale passive device 500 comprises an alternative arrangement of insulator layer 108 and the particles within insulator layer 108. The insulator layer 108 of micro-scale passive device and the particles therein may be configured to increase a breakdown electric field and/or decrease a maximum electric field of the micro-scale passive device 500.

Micro-scale passive device 500 is arranged on a device substrate 102 having an upper surface 104, and includes a layer 106, an insulator layer 108, a conductor 110, a conductor 112, insulative particles 116, conductive or nonlinear conductive particles 316, particles 516, terminal 118a, terminal 118b, and terminal 118c. Insulator layer 108 includes insulator layer portion 108a, insulator layer portion 108b, and insulator layer portion 108c. Device substrate 102 includes semiconductor substrate 120, conductive layer 120, and insulative layer 122.

Micro-scale passive device 500 shown in FIG. 5 differs from micro-scale passive devices 100, 200, 300, and 400 shown in FIGS. 1, 2, 3, and 4 in that it includes both insulative particles 116 and conductive or nonlinear conductive particles 316. In the exemplary embodiment of micro-scale passive device 500 illustrated by FIG. 5, the insulative particles 116 are shown in first region 314a, within insulator layer portion 108a, and the insulative particles 116 are not shown in third region 314c, within insulator layer portion 108c. The conductive or nonlinear conductive particles 316 are shown in third region 314c, within insulator layer portion 108c, and the conductive or nonlinear conductive particles 316 are not shown in first region 314a, within insulator layer portion 108a.

Micro-scale passive device 500 also includes particles 516 in second region 314b, within second insulator layer portion 108b. The particles 516 may comprise insulative particles and/or conductive or nonlinear conductive particles. Accordingly, in second region 314b, within second insulator layer portion 108b, there may be insulative particles and no conductive or nonlinear conductive particles, conductive or nonlinear conductive particles and no insulative particles, or insulative particles and conductive or nonlinear conductive particles.

Micro-scale passive device 500 may therefore include similar structure and functionality as described above with respect to micro-scale passive devices 100, 200, 300, and 400 shown in FIGS. 1, 2, 3, and 4, or a combination of such structures and functionalities.

A method of manufacturing a micro-scale passive device may comprise the steps of forming each of the layers and/or patterning each of the conductors described with respect to any of FIGS. 1, 2, 3, 4, and 5. For example, at least one of insulative particles or conductive or nonlinear conductive particles may be introduced into a liquid material. A substrate may be provided. A layer may be formed on the substrate. A conductor may be formed on the layer and may be patterned in the arrangements described above. At least one insulator layer may be formed above and/or around the conductor. Another conductor may be formed above the insulator layer and may be patterned in the arrangements described above. At least one insulator layer may be formed above and/or around the other conductor. Insulator layers may be formed using the liquid material with the particles introduced therein or using a liquid material without particles introduced therein, and the at least one insulator layer may be formed by curing the liquid material.

A method of operating a micro-scale passive device may comprise the steps of applying a set of signals to the terminals of a first conductor and the terminals of a second conductor of the micro-scale passive device to provide an electric field is between the first conductor and the second conductor. The method may comprise increasing a breakdown electric field of the device and/or reducing the maximum electric field of the device, thereby increasing a lifespan of the device and/or increasing a threshold electric field of the device. The method may comprise increasing the breakdown electric field using the insulative particles. The method may comprise reducing the maximum electric field using the conductive or nonlinear conductive particles.

While insulative particles or conductive or nonlinear conductive particles within insulator layers in the present application may generally be described with respect to micro-scale passive devices such as transformers and capacitors, aspects of the present application may be applied to other electronic devices. For example, in some embodiments, insulative particles or conductive or nonlinear conductive particles within insulator layers described in the present application may be applied to other transformers, capacitors, other micro-scale devices, or other electronic devices that exhibit undesirable electric fields or maximum electric fields.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

The terms "approximately," "substantially," and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. An isolated micro-scale passive device comprising:
a first conductor and a second conductor formed on a substrate;
a first insulator layer disposed over the first conductor;
a second insulator layer disposed at least partially between the first insulator layer and the second conductor; and
a plurality of conductive or nonlinear conductive particles embedded in at least a portion of the second insulator layer, wherein:
a first portion of the second insulator layer has a first conductivity; and
the plurality of conductive or nonlinear conductive particles define a second portion of the second insulator layer with a second conductivity greater than the first conductivity.

2. The isolated micro-scale passive device of claim 1, wherein at least a subset of the plurality of conductive or nonlinear conductive particles are disposed between the first conductor and the second conductor.

3. The isolated micro-scale passive device of claim 1, comprising a third insulator layer disposed over the second conductor with an additional plurality of conductive or nonlinear conductive particles disposed in the third insulator layer.

4. The isolated micro-scale passive device of claim 1, further comprising a plurality of insulative particles embedded in at least one of the first insulator layer or the second insulator layer.

5. The isolated micro-scale passive device of claim 4, wherein:
at least a subset of the plurality of insulative particles form an isolation layer between the first conductor and the second conductor; and
at least a subset of the plurality of conductive or nonlinear conductive particles form a barrier layer of the second conductor.

6. The isolated micro-scale passive device of claim 1, wherein the plurality of conductive or nonlinear conductive particles comprise at least one of SiC, ZnO, $Ag_2C_2$, graphene, carbon nanotubes, or a negative temperature coefficient (NTC) material.

7. The isolated micro-scale passive device of claim 1, wherein the plurality of conductive or nonlinear conductive particles have a size between 1 nm and 1 um.

8. The isolated micro-scale passive device of claim 1, wherein the plurality of conductive or nonlinear conductive particles have a conductivity between $1\times10^{-8}$ S/m and 100 MS/m.

9. The isolated micro-scale passive device of claim 1, wherein the plurality of conductive or nonlinear conductive particles have a particle-to-particle distance in the second insulator layer such that conductivity of at least the second insulator layer having the plurality of conductive or nonlinear conductive particles embedded therein is below a percolation threshold.

10. The isolated micro-scale passive device of claim 1, wherein:
the first conductor is patterned as a first coil; and
the second conductor is patterned as a second coil.

11. The isolated micro-scale passive device of claim 1, wherein:
the first conductor is disposed in a first plane; and
the second conductor is disposed in a second plane parallel to the first plane, the second plane different than the first plane.

12. The isolated micro-scale passive device of claim 1, wherein:
at least a portion of the first conductor is disposed in a first plane; and
at least a portion of the second conductor is disposed in the first plane.

13. An isolated micro-scale passive device comprising:
a first conductor and a second conductor formed on a substrate; and
means for increasing, between the first conductor and the second conductor, a threshold electric field for operating without breakdown of the isolated micro-scale passive device, wherein the means for increasing the threshold electric field for operating without breakdown includes a first insulator layer disposed over the first conductor and a second insulator layer disposed at least partially between the first insulator layer and the second conductor.

14. The isolated micro-scale passive device of claim 13, wherein the means for increasing the threshold electric field for operating without breakdown is configured to reduce a maximum electric field of the isolated micro-scale passive device.

15. The isolated micro-scale passive device of claim 13, wherein the means for increasing the threshold electric field for operating without breakdown comprises a plurality of conductive or nonlinear conductive particles embedded in the second insulator layer disposed between the first conductor and the second conductor, wherein:
a first portion of the second insulator layer has a first conductivity; and
the plurality of conductive or nonlinear conductive particles define a second portion of the second insulator layer with a second conductivity greater than the first conductivity.

16. The isolated micro-scale passive device of claim 15, wherein the means for increasing the threshold electric field for operating without breakdown further comprises a plurality of insulative particles embedded in at least one of the first insulator layer or the second insulator layer.

* * * * *